(12) United States Patent
Aronovich et al.

(10) Patent No.: US 8,839,062 B2
(45) Date of Patent: Sep. 16, 2014

(54) INCREMENTAL MODIFICATION OF AN ERROR DETECTION CODE BACKGROUND OF THE INVENTION

(75) Inventors: Lior Aronovich, Toronto (CA); Michael Hirsch, Mazkeret Batya (IL); Shmuel T. Klein, Rehovot (IL); Yair Toaff, Givat Shmuel (IL)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 13/348,453

(22) Filed: Jan. 11, 2012

(65) Prior Publication Data

US 2013/0179759 A1   Jul. 11, 2013

(51) Int. Cl.
*G01R 31/316* (2006.01)
*G06F 11/25* (2006.01)
*G01R 31/3167* (2006.01)

(52) U.S. Cl.
CPC .................................. *G01R 31/3167* (2013.01)
USPC ............ 714/740; 714/737; 714/738; 714/807

(58) Field of Classification Search
CPC ...................... G01R 31/3167; G01R 31/31924; G01R 31/2884; G01R 31/31908; H05K 999/99
USPC .................................. 714/740, 737, 738, 807
See application file for complete search history.

(56) References Cited

U.S. PATENT DOCUMENTS

| | | |
|---|---|---|
| 5,778,395 A | 7/1998 | Whiting et al. |
| 6,038,694 A | 3/2000 | Swallow |
| 6,357,030 B1 | 3/2002 | Demura et al. |
| 6,519,737 B1 | 2/2003 | Derby |

(Continued)

FOREIGN PATENT DOCUMENTS

| | | |
|---|---|---|
| CN | 101449464 A | 6/2009 |
| EP | 0661702 A2 | 12/1994 |

(Continued)

OTHER PUBLICATIONS

Andreas Doering et al., "Fast and Flexible CRC Calculation," 2004, 5 pages.

(Continued)

*Primary Examiner* — Sam Rizk
*Assistant Examiner* — Kyle Vallecillo
(74) *Attorney, Agent, or Firm* — Griffiths & Seaton PLLC (57) ABSTRACT

Exemplary method, system, and computer program product embodiments for an incremental modification of an error detection code operation are provided. In one embodiment, by way of example only, for a data block requiring a first error detection code (EDC) value to be calculated and verified and is undergoing modification for at least one randomly positioned sub-blocks that becomes available and modified in independent time intervals, a second EDC value is calculated for each of the randomly positioned sub-blocks. An incremental effect of the second EDC value is applied for calculating the first EDC value and for recalculating the first EDC value upon replacing at least one of the randomly positioned sub-blocks. The resource consumption is proportional to the size of at least one of the randomly positioned sub-blocks that are added and modified. Additional system and computer program product embodiments are disclosed and provide related advantages.

24 Claims, 6 Drawing Sheets

(56) References Cited

U.S. PATENT DOCUMENTS

| | | |
|---|---|---|
| 6,904,558 B2 | 6/2005 | Cavanna et al. |
| 6,961,893 B1 | 11/2005 | Mukund et al. |
| 7,185,266 B2 | 2/2007 | Blightman et al. |
| 7,243,289 B1 | 7/2007 | Madhusudhana et al. |
| 7,631,251 B2 | 12/2009 | Bower |
| 7,886,210 B2 | 2/2011 | Leonard et al. |
| 2007/0268834 A1 | 11/2007 | Buckley et al. |
| 2009/0019337 A1 | 1/2009 | Pi et al. |
| 2009/0077456 A1 | 3/2009 | Pi et al. |
| 2009/0077457 A1* | 3/2009 | Ramesh et al. ............... 714/807 |
| 2011/0113313 A1* | 5/2011 | Thiesfeld et al. ............. 714/807 |

FOREIGN PATENT DOCUMENTS

| | | | |
|---|---|---|---|
| JP | 2000181807 A | 6/2000 | |
| KR | 20090019784 A | 2/2009 | |
| WO | 2007136913 A2 | 11/2007 | |

OTHER PUBLICATIONS

Michael E. Kounavis et al., "A Systematic Approach to Building High Performance, Software-based, CRC Generators," IEEE, 2005, 11 pages.

Julian Satran et al., "Out of Order Incremental CRC Computation," IEEE Transactions on Computers, vol. 54, No. 9, Sep. 2005, 4 pages.

Yan Sun et al., "A Table-Based Algorithm for Pipelined CRC Calcuation," IEEE, 2010, 5 pages.

Karp and Rabin, "Efficient Randomized Pattern-Matching Algorithms", IBM Journal of Research and Development vol. 31, No. 2, Mar. 1987.

Rabin, "Fingerprinting by random polynomials", Technical Report, TR-15-81, [online], Harvard University, Department of Computer Science, 1981 [retrieved on Apr. 15, 2013], Retrieved from the Internet: <URL:http://www.xmailserver.org/rabin.pdf>.

* cited by examiner

INCREMENTAL MODIFICATION OF AN ERROR DETECTION CODE BACKGROUND OF THE INVENTION

BACKGROUND OF THE INVENTION

1. Field of the Invention

The present invention relates generally to computers, and more particularly, to an incremental modification of an error detection code operation in a computing environment.

2. Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. Data storage systems need to protect their users from accidental data corruption. Data corruption can occur as a result of hardware failure or software faults. The industry standard for detecting data corruption is the cyclical redundancy check (CRC).

SUMMARY OF THE DESCRIBED EMBODIMENTS

As mentioned previously, data storage systems need to protect their users from accidental data corruption. Data corruption can occur as a result of hardware failure or software faults. The industry standard for detecting data corruption is the cyclical redundancy check (CRC). An error detection algorithm may be used to take as input a segment of data (e.g. of size 256 KB) and output a compact error detecting code (EDC), whose typical size may be 32 bits or 64 bits, which is a condensed summary of the data. A high probability exists that the EDC may be changed if computed from an input data segment that differs even by one single bit of data from the original data. Thus, storing and updating the EDC's present a significant challenge. First, computing CRC in software consumes a large amount of the computing resources (e.g., a central processing unit "CPU") power and is considered an expensive operation. Second, storage devices must store an EDC for every segment of data to ensure data integrity, which increases storage overhead. Typically, storage devices store one EDC for relatively large stored data segments in order to reduce this overhead. Thus, a need exists for increasing the efficiency and production by a more efficient error detecting algorithm (EDA) used for detecting data corruption.

Accordingly, and in view of the foregoing, various exemplary method, system, and computer program product embodiments for incremental modification of an error detection code are provided. In one embodiment, by way of example only, for a data block requiring a first error detection code (EDC) value to be calculated and verified and is undergoing modification for at least one randomly positioned sub-blocks that becomes available and modified in independent time intervals, a second EDC value is calculated for each of the randomly positioned sub-blocks. An incremental effect of the second EDC value is applied for calculating the first EDC value and for recalculating the first EDC value upon replacing at least one of the randomly positioned sub-blocks. The resource consumption is proportional to the size of at least one of the randomly positioned sub-blocks that are added and modified. Additional system and computer program product embodiments are disclosed and provide related advantages.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF CERTAIN EMBODIMENTS

As mentioned previously, data storage systems need to protect their users from accidental data corruption. Data corruption can occur as a result of hardware failure or software faults. The industry standard error detection algorithm (EDA) for detecting data corruption is the cyclical redundancy check (CRC). An EDA may be used to take as input a segment of data (e.g. of size 256 KB) and outputs a compact error detecting code (EDC), whose typical size may be 32 bits or 64 bits, which is a condensed summary of the data. A high probability exists that the EDC may be changed if computed from an input data segment that differs even by one single bit of data from the original data. First, computing CRC in software consumes a large amount of the computing resources (e.g., a central processing unit "CPU") power and is considered an expensive operation. Second, storage devices must store an EDC for every segment of data to ensure data integrity, which increases storage overhead. Typically, storage devices store one EDC for relatively large stored data segments in order to reduce this overhead. Thus, a need exists for increasing the efficiency and production by an error detecting algorithm (EDA) used for detecting data corruption.

Also, as described in the description below and several of the figures, traditional CRC is the CRC value computed using the current state of the art that does not include the mechanisms of the present invention and is indicated by "tCRC." The "hktCRC" indicates an incremental EDA for random data arrival as illustrated in the workings of the present invention. It is the Karp-Rabin hash of the block, and may produce a 32 bit EDC. The term "block" indicates a segment of data protected by the EDA and may be 256 KB (Kilobytes). The term "sub-block" denotes a contiguous subsequence of a block, and may be a fixed size on a fixed boundary (e.g., 512 bytes aligned to 512 bytes) or variable sized and not aligned with any fixed boundary. The term "subset" is used to denote one or more sub-blocks. The term "CRC" of the present invention may also include the tCRC or hktCRC applied to a block of data. A "digest" is the result of applying a CRC to a sub-block.

For example, consider the read-modify-write problem of a storage device that stores a CRC EDC for every segment of data. If an application reads and then updates a subset of bytes of the segment at some arbitrary position inside the segment, the storage device must perform the following steps listed A1 through A8:

A1. read the entire segment,
A2. check the current CRC EDC of the entire segment [cost O(size of the segment)],
A3. return the subset of bytes at the arbitrary position back to the application,
A4. accept a modified subset of bytes back from the application,
A5. compute what the updated CRC EDC of the entire segment would be after the modified subset of bytes would be copied back into the segment [cost O(size of the segment)],
A6. check that the current CRC EDC of the unmodified segment has not changed [cost O(size of the segment)],
A7. copy the modified subset of bytes back into the segment at its arbitrary position, and
A8. store the modified segment and the updated CRC EDC.

In this scheme, the CRC EDC is computed three times on the entire segment of data. Also the necessity of step A6 is required. Since step A5 used the data that may have changed since starting step A1, it is mandatory to ensure that the data was not accidentally changed and the wrong data used to calculate the updated CRC EDC in step A5.

In contrast, and to address the inefficiencies previously described, the mechanisms of the illustrated embodiments, for a data block requiring a cyclic redundancy check (CRC) value to be calculated and verified, configure the data block to contain randomly positioned sub-blocks adapted to become available and modified in independent time intervals. A CRC value is calculated for each of the randomly positioned sub-blocks. The classified data chunks are encoded by at least one the compression operations. An incremental effect of the CRC value of the randomly positioned sub-blocks are applied for calculating the CRC value of the data block and for recalculating the CRC value of the data block upon replacing at least one randomly positioned sub-blocks. The amount of resources consumption is proportional to the size of the randomly positioned sub-blocks that are added and modified. (It should be noted that the error detection algorithm in this application is referred to as error detection algorithm (EDA). The term EDA EDC is used to describe the error detecting code calculated using the EDA disclosed herein. The EDA has the property that it may calculate the effect on the EDC of any changed subset of bytes (or even any changed bit) in the segment. In addition, EDA may do so in time that is proportional to the size of the changes, rather than in time that is proportional to the size of the entire segment, as done by traditional CRC methods.

For example, consider the same sequence, as illustrated above, of an application modifying a subset of bytes in a segment by the following steps B1 through B8:

B1. read the entire segment
B2. check the current EDA EDC of the entire segment [cost O(size of the segment)]
B3. Return the old subset of bytes at the arbitrary position back to the application and calculate a digest of this subset [cost O(size of the subset)]
B4. accept a modified subset of bytes back from the application and calculate a digest of the modified subset [cost O(size of the subset)]
B5. compute what the updated EDA EDC of the entire segment would be after the modified subset of bytes would be copied back into the segment [cost O(1), constant time operation]
B6. (no need to recalculate the current EDA EDC of old segment)
B7. copy the modified subset of bytes back into the segment at its arbitrary position
B8. store the modified segment and the updated EDA EDC In this scheme, step B5 reduces the resource consumption and a cheaper alternative than the previous scheme, which included step A5. Step B5 is executed in constant time using the digests of the original and modified subsets, which were calculated in time proportional to the size of the subset (not proportional to the size of the segment). Step B5 did not use any stored data to calculate the updated EDA EDC, but rather, only the current EDA EDC for a digest of the subset given to the application at step B3 and a digest of the modified subset accepted from the application at step B4. In the first example, step A6 has to recalculate the CRC EDC on the entire segment (e.g. of size 256 KB), but in the second example, step B6 is not necessary.

In an alternative embodiment, in comparison to the traditional CRC that must calculate the CRC EDC at least three times on the entire segment in order to ensure safety, the EDA of the present invention only needs to be computed once on the entire segment and may compute the digest of the subset twice (once on the old subset and once on the modified subset). The CRC EDC's may be computed efficiently in hardware given the existence of XOR gates. Moreover, the EDA of the present invention uses remainder-by-division arithmetic, which is easier to understand while providing increased efficiency for implementation. The mathematical analysis of the traditional CRC algorithm in the current state of the art is complicated by the requirement to map the CRC algorithm to arithmetic on an n-degree polynomial in a Galois Field (GF) of 2.

A bit-replacement principle allows a tCRC to be computed incrementally such that if a tCRC of a prefix of a segment has been calculated, the calculation may continue from the point at which it was stopped. In contrast, the present invention may modify the tCRC for out-of-order reception in a communication protocol, which allows a final EDC to be assembled from the digests of the sub-blocks, which can be computed upon arrival.

As will be described below, the mechanisms of the present invention consider using remainder by division as an EDA. The segment is a sequence of bytes that can be viewed as a very large number and the remainder of this number when divided by a second number serves as the EDC. The mechanisms of the present invention illustrate how to calculate the effect on the EDC of an arbitrary change to a sub-block of the segment. Furthermore, this disclosure includes the possibility that the digest for the subsets may also be a tCRC.

Figure 1:
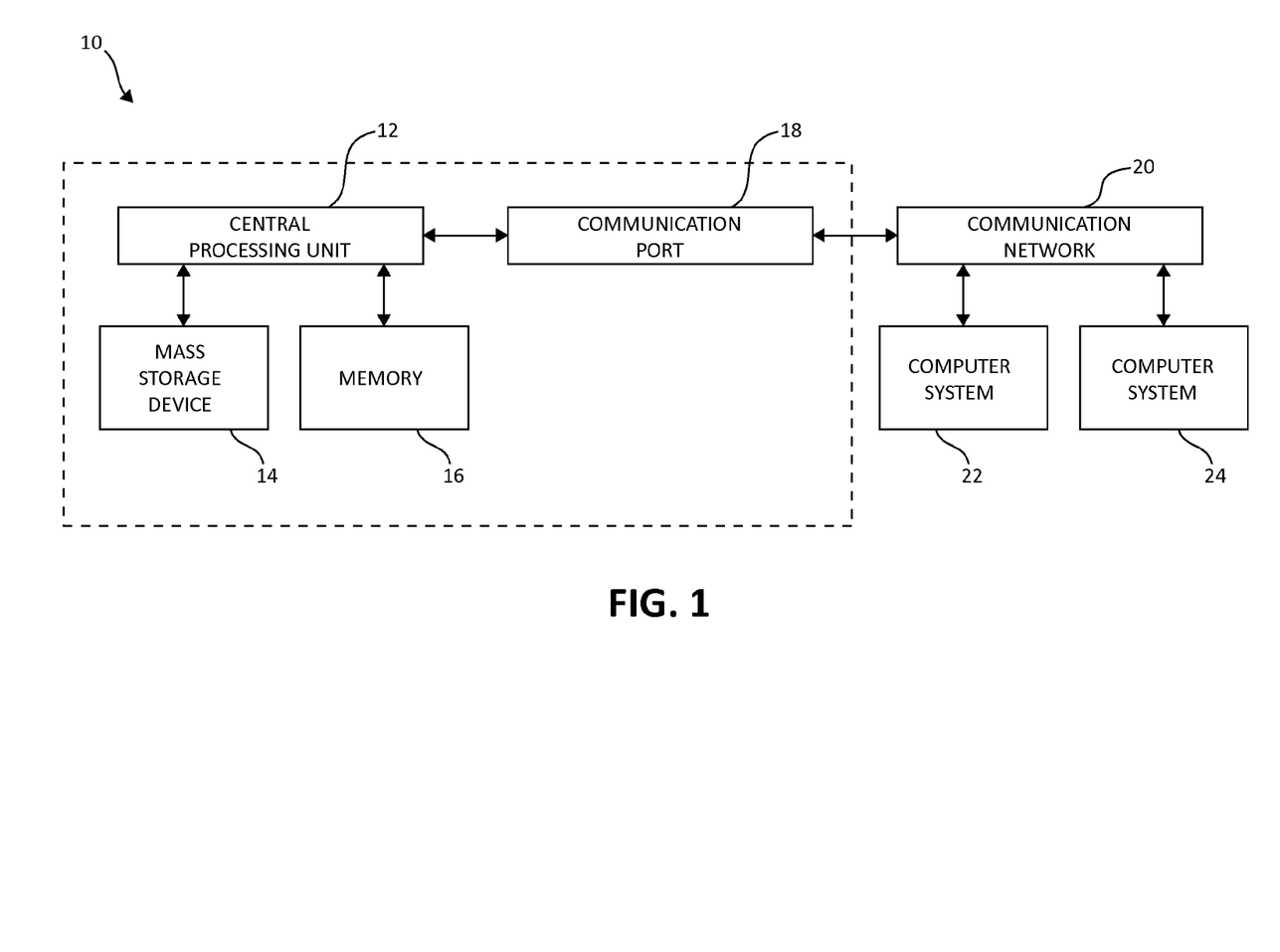
FIG. 1 illustrates a computer storage environment having an example storage device in which aspects of the present invention may be realized.

Turning to FIG. 1, an example computer system 10 is depicted in which aspects of the present invention may be realized. Computer system 10 includes central processing unit (CPU) 12, which is connected to mass storage device(s) 14 and memory device 16. Mass storage devices may include hard disk drive (HDD) devices, which may be configured in a redundant array of independent disks (RAID). Memory device 16 may include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24. The computer system 10 may include one or more processor devices (e.g., CPU 12) and additional memory devices 16 for each individual component of the computer system 10.

Figure 2:
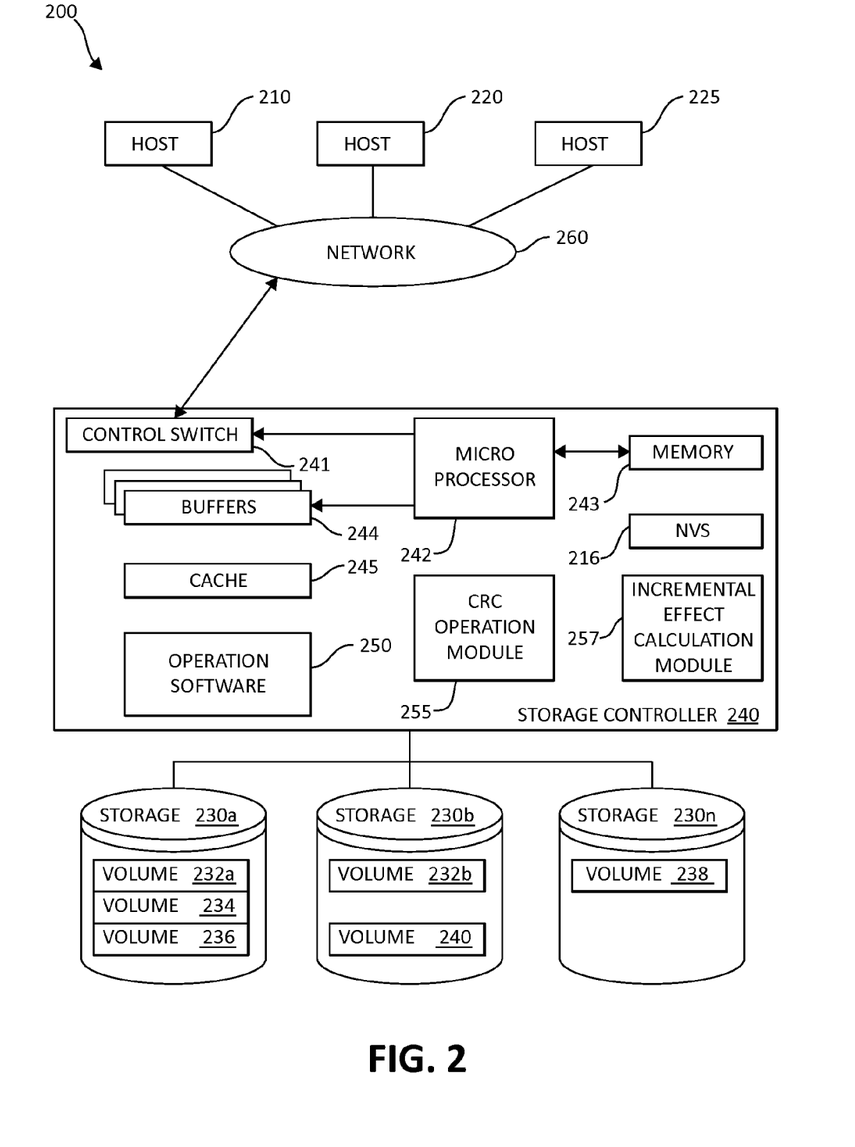
FIG. 2 illustrates an exemplary block diagram showing a hardware structure of a data storage system in a computer system in which aspects of the present invention may be realized.

FIG. 2 is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. A Network (e.g., storage fabric) connection 260 may be a fibre channel fabric, a fibre channel point-to-point link, a fibre channel over ethernet fabric or point to point link, a FICON or ESCON I/O interface. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Moreover, given the use of the storage fabric network connection 260, additional architectural configurations may be employed by using the storage fabric 260 to connect multiple storage controllers 240 together with one or more cluster hosts 210, 220, and 225 connected to each storage controller 240.

In some embodiments, the system memory 243 of storage controller 240 includes operation software 250 and stores program instructions and data which the processor 242 may access for executing functions and method steps associated with executing the steps and methods of the present invention. As shown in FIG. 2, system memory 243 may also include or be in communication with a cache 245, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described herein.

In some embodiments, cache 245 may be implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

The storage controller 240 may include a CRC operation module 255 and an incremental effect calculation module 257. The CRC operation module 255 and incremental effect calculation components 257 may be one complete module functioning simultaneously or separate modules. The CRC operation module 255 and incremental effect calculation components 257 may have some internal memory (not shown) in which the compression algorithm may store unprocessed, processed, or "semi-processed" data. The CRC operation module 255 and incremental effect calculation module 257 may work in conjunction with each and every component of the storage controller 240, the hosts 210, 220, 225, and other storage controllers 240 and hosts 210, 220, and 225 that may be remotely connected via the storage fabric 260. Both the CRC operation module 255 and incremental effect calculation module 257 may be structurally one complete module or may be associated and/or included with other individual modules. The CRC operation module 255 and incremental effect calculation module 257 may also be located in the cache 245 or other components of the storage controller 240.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, cache 245 for temporarily storing (buffering) data, and buffers 244 for assisting the cache 245 to read and write data, a control switch 241 for controlling a protocol to control data transfer to or from the CRC operation module 255 and the incremental effect calculation module 257 in which information may be set. Multiple buffers 244 may be implemented to assist with the methods and steps as described herein. In one embodiment, the cluster hosts/nodes, 210, 220, 225 and the storage controller 240 are connected through a network adaptor (this could be a fibre channel) 260 as an interface i.e., via a switch called "fabric."

In one embodiment, the operation of the system shown in FIG. 2 may be described as follows. The microprocessor 242 may control the memory 243 to store command information from the cluster host/node device (physical or virtual) 210 and information for identifying the cluster host/node device (physical or virtual) 210. The control switch 241, the buffers 244, the cache 245, the operating software 250, the microprocessor 242, memory 243, NVS 216, CRC operation module 255, and incremental effect calculation module 257 are in communication with each other and may be separate or one individual component(s). Also, several, if not all of the components, such as the operation software 250 may be included with the memory 243. Each of the components within the devices shown may be linked together and may be in communication with each other for purposes suited to the present invention.

Figure 3:
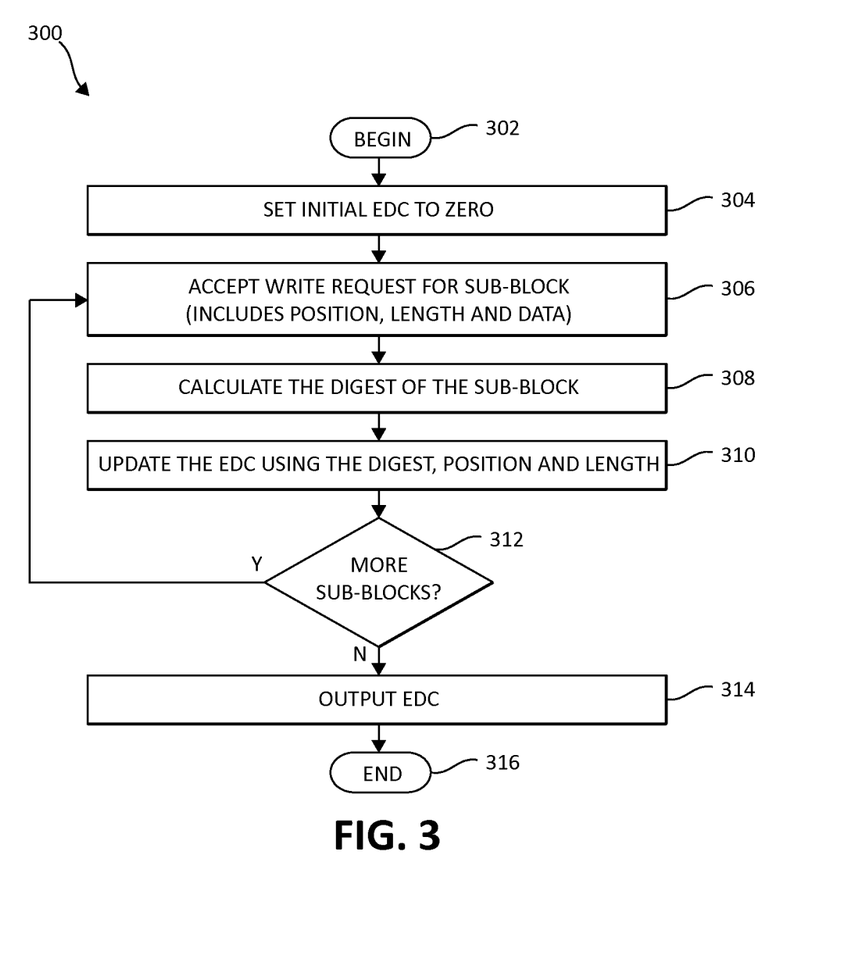
FIG. 3 is a flowchart illustrating an exemplary method for calculating the initial error detection code when the data of a segment may arrive in arbitrary order.

FIG. 3 is a flowchart illustrating an exemplary method 300 for calculating the initial error detection code when the data of a segment may arrive in arbitrary order. The method 300 begins (step 302) by setting an initial EDC to zero (step 304). The method 300 may accept a write request for sub-block, which may include position, length, and data (step 306). The digest of the sub-block is calculated (step 308). The EDC is updated using the digest, position, and length (step 310). The method 300 may determine and check if there are more sub-blocks (step 312) and if there are, the method 300 will return to step 306 and accept a write request for sub-block, which may include position, length, and data. If there are no more sub-blocks, the method 300 may output the EDC (step 314). The method 300 ends (step 316).

In one embodiment, an error detecting algorithm (EDA) may be used to detect data corruption. The EDA may calculate an error detecting code (EDC) on a segment of data in 2 ways. The first way processes all the bytes in a data segment. The work needed to do this is proportional to the size of the segment. The second way provides that the EDA may incrementally calculate the EDA EDC. Given the EDA EDC of a segment of data, the digest of an original subset of the segment and the digest of a subset of modified data that replaces the original subset in the segment, the EDA algorithm may calculate the EDA EDC of the changed segment in constant time. The costs of calculating the digests of the original and modified subsets are proportional to their sizes and not proportional to the size of the segment. This provides large savings in computing power needed by random-access data storage devices that must assure data integrity using error detection codes. The mechanisms of the present invention apply the usage of the Karp-Rabin hash function to implement the block EDC and sub-block digest functions and teach how to calculate the incremental effect of a Karp-Rabin hash value of at least one of the randomly positioned sub-blocks on the Karp-Rabin hash value of the data block. However, the sub-block digest value may be calculated by several CRC functions (e.g., using an accelerated hardware CRC function) for implementing the sub-block digest value.

The Rabin-Karp hash is used extensively in string matching algorithms, in part because it is a rolling hash. That is, an initial (or base) hash is calculated for a window (or seed) of bytes that is a part of a larger segment of data. Then the window is shifted down one byte (i.e. one byte from the segment leaves the window and another enters). Then the hash of the bytes in the window at its new position is calculated. For calculating a remainder by division, according to one embodiment of the present invention, a sequence of bytes of a binary string are divided into multiple blocks or subsets. A first remainder by division associated with a first subset (or block) of the sequence of bytes is calculated. A second remainder by division associated with a second subset of the sequence of bytes is calculated. The calculating of the second remainder by division may occur at least partially during the calculating of the first remainder by division. A third remainder by division is calculated based on the calculating of the first remainder by division and the calculating of the second remainder by division. By using remainder by division as and EDA, the mechanisms take into account random updates to the very large number.

Furthermore, the EDA algorithm provides increased efficiency for implementation on a general purpose CPU since the EDA algorithm uses multi-byte primitives that already exist and does not need large pre-computed tables, which tables require significant work for reducing the size of the segment. Also, the digests of the original and modified subsets may be calculated using a hardware CRC and may be used to combine the digests of the original and modified subsets into an EDC that receives the benefit from both the faster hardware computation of the CRC and the EDA technique of combining digests into an EDC.

In one embodiment, the EDA EDC of a segment of length "n" bytes long is the remainder by division of the segment, interpreted as a very large integer, when divided by some prime number P. The digest d of a subset of the segment that starts at position "pos" and is of length "len" is the remainder by division of the subset, interpreted as a very large integer, when divided by P. The distance m of the subset from then end of the segment is given by the formula:

$$m = n - (pos + len) \quad (1)$$

The weighted effect of the contribution of the digest to the EDA EDC depends on its distance m from the end of the segment by formula and is given by the equation:

$$\text{effect}_d = (d * 2^{8m}) \bmod P \quad (2)$$

which is equivalent to $$\text{effect}_d = ((d \bmod P) * (2^{8m} \bmod P)) \bmod P \quad (3)$$

which is equivalent to $$\text{effect}_d = (d * (2^{8m} \bmod P)) \bmod P \quad (4)$$

where $\text{effect}_d$ is the incremental effect, d is the second EDC value of the at least one of the plurality of randomly positioned sub-blocks, mod is remainder after division by the divisor, m is the distance of the at least one of the plurality of randomly positioned sub-blocks from the end of the segment, 8 represents 8 bits in a byte, and P is a prime number. Also, d is smaller than P since it is a remainder after dividing by P, and $(2^{8m} \bmod P)$ is a constant that may be pre-calculated. It should be noted that an added efficiency is obtained since $\text{effect}_d$ may be calculated with regular 64-bit arithmetic if P is a 32-bit prime number.

Given a new subset of the segment whose digest is $d_{new}$, the effect of it replacing an old subset of the segment with the same length len and starting at the same position pos whose digest is $d_{old}$ is given by the equation:

$$edc_{new} = (edc_{old} + \text{effect}_{dnew} - \text{effect}_{dold}) \bmod P \quad (5)$$

or equivalently, $$edc_{new} = (edc_{old} + ((d_{new} - d_{old}) * (2^{8m} \bmod P))) \bmod P \quad (6)$$

where $edc_{new}$ is a newest calculated first EDC value, and $edc_{old}$ is a last calculated first EDC value, $\text{effect}_{dnew}$ is a newest calculated incremental effect of a newest calculated second EDC value, the $\text{effect}_{dold}$ is a last calculated incremental of a last calculated second EDC value, and the $d_{new}$ is the newest calculated second EDC value.

In some scenarios, the use of equation 6 provides for enhanced implementation for calculating the remainder by division of a large integer by a smaller integer given a convenient value chosen for the divisor P. As an alternative, this method can be adapted to using the tCRC as the digest of a subset of a segment. The subsets are limited to be of fixed lengths len', and to start on boundaries that are multiples of len'. The EDC edccrc of a segment that is made up of k=len/len' such subsets each with CRC EDC $crc_i$ is given by the equation:

$$edccrc = (\text{sum}(i=0 \text{ to } i=k-1)(crc_i * (2^{8(len-(i+1)*len')} \bmod P)) \bmod P \quad (7)$$

where edccrc is a newest calculated first CRC value, k is a number of fixed lengths of the at least one of the plurality of randomly positioned sub-blocks, i is an arbitrary value representing the number of the first CRC value, $crc_i$ is the ith number of the first CRC value, 8 is 8 bits in a byte, len is a fixed length of the at least one of the plurality of randomly positioned sub-blocks, i is an arbitrary value, and P is a prime number.

Added efficiency is obtained since edccrc can be calculated with regular 64-bit arithmetic if P is a 32-bit prime number. Equations (2)-(6) are valid for this adaptation with the d, $d_{new}$ and $d_{old}$ replaced by the CRC of the respective subsets of the segment. In this adaptation, the CRC may be calculated using a hardware assist function for a further performance gain.

The EDA of the present invention detects the classes of errors, changed data, and data subsets that have swapped positions with other data subsets in the same segment. Unlike the current state of the art, the EDA is given the segment size as part of its computation and thus may detect how many leading zeros are in a given segment. For this reason, in the current state of the art requires the CRC calculation to be primed with an all-1 initial value. For a 32-bit CRC, this value is 0xffffffff. The mechanisms of the present invention for the EDA do not have this handicap since the segment size is given during the EDA algorithm calculation. Moreover, the traditional CRC, of the current state of the art, calculates the remainder when dividing the input interpreted as a polynomial by a divisor polynomial using GF(2) arithmetic. GF(2) arithmetic is more commonly known as arithmetic that has only the XOR no-carry operator instead of both the usual plus and minus. The EDA of the present invention calculates the remainder when dividing the input interpreted as a large integer by a prime number using regular arithmetic. The 32-bit traditional CRC EDC values are in the range 0 to $2^{32}-1$. The EDA EDC values, of the present invention, are in the range 0 to $2^{32}-6$ when using the prime number ($2^{32}-5$). Also, the traditional CRC has a probability of an undetected error of $1/2^{32}$. The EDA has a probability of an undetected error of $1/(2^{32}-5)$ when using the prime number ($2^{32}-5$).

Figure 4:
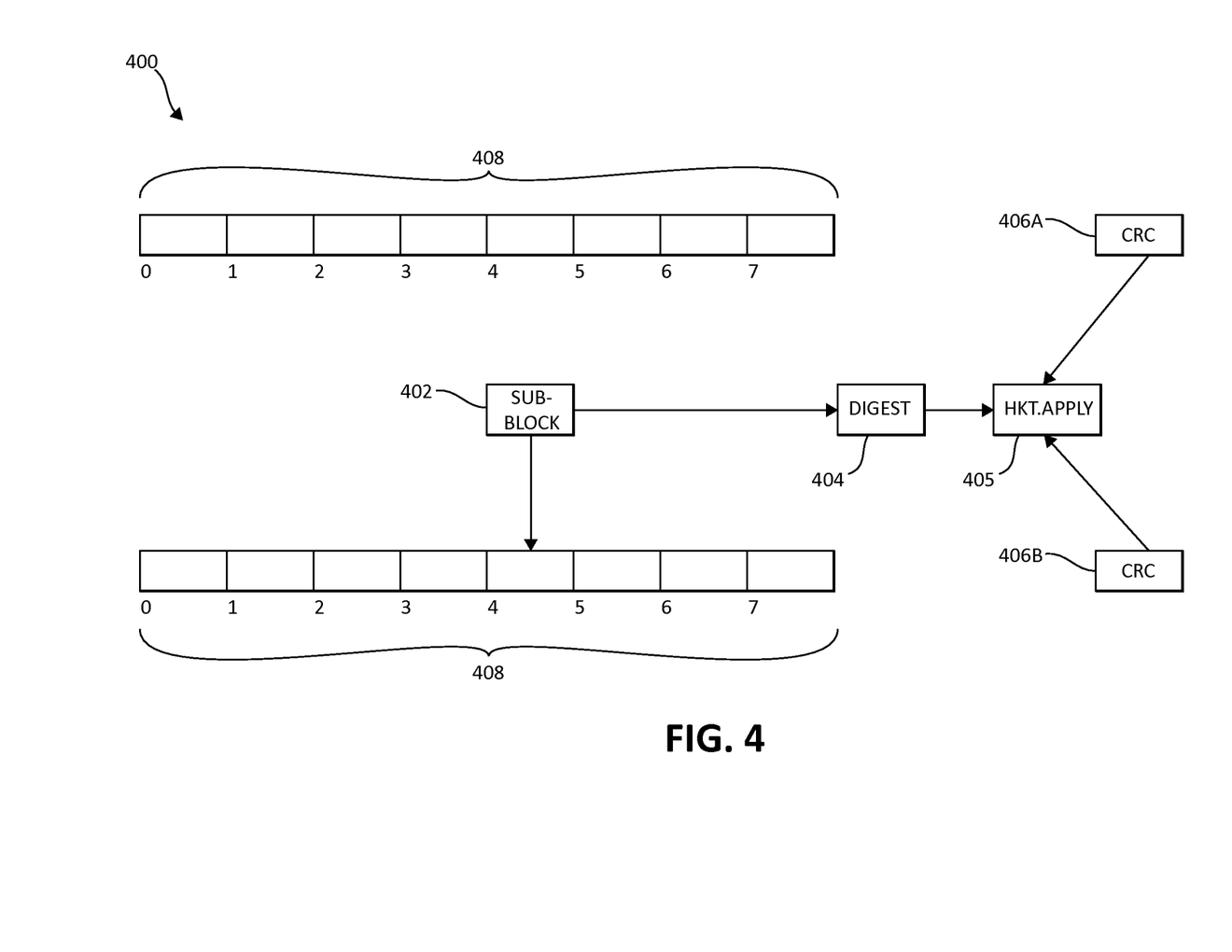
FIG. 4 illustrates an exemplary block diagram for calculating the initial error detection code when the data of a segment may arrive in arbitrary order.

FIG. 4 illustrates an exemplary block diagram 400 for calculating the initial error detection code when the data of a segment may arrive in arbitrary order. A block of data 408 contains several randomly positioned sub-block 402 (labeled 0-7). The sub-block 402 #4 shows the random arrival of data. The digest 404 is calculated as the sub-block number 402 #4 arrives, which immediately protects the data. The digest 404 is applied to the EDC 406 when the sub-block 402 is copied into the block 408. The hktCRC 405, which is the incremental EDA for random data arrival, is applied and used to assist in calculating the EDC 406 (illustrated as 406A and 406B of the data block.

Figure 5:
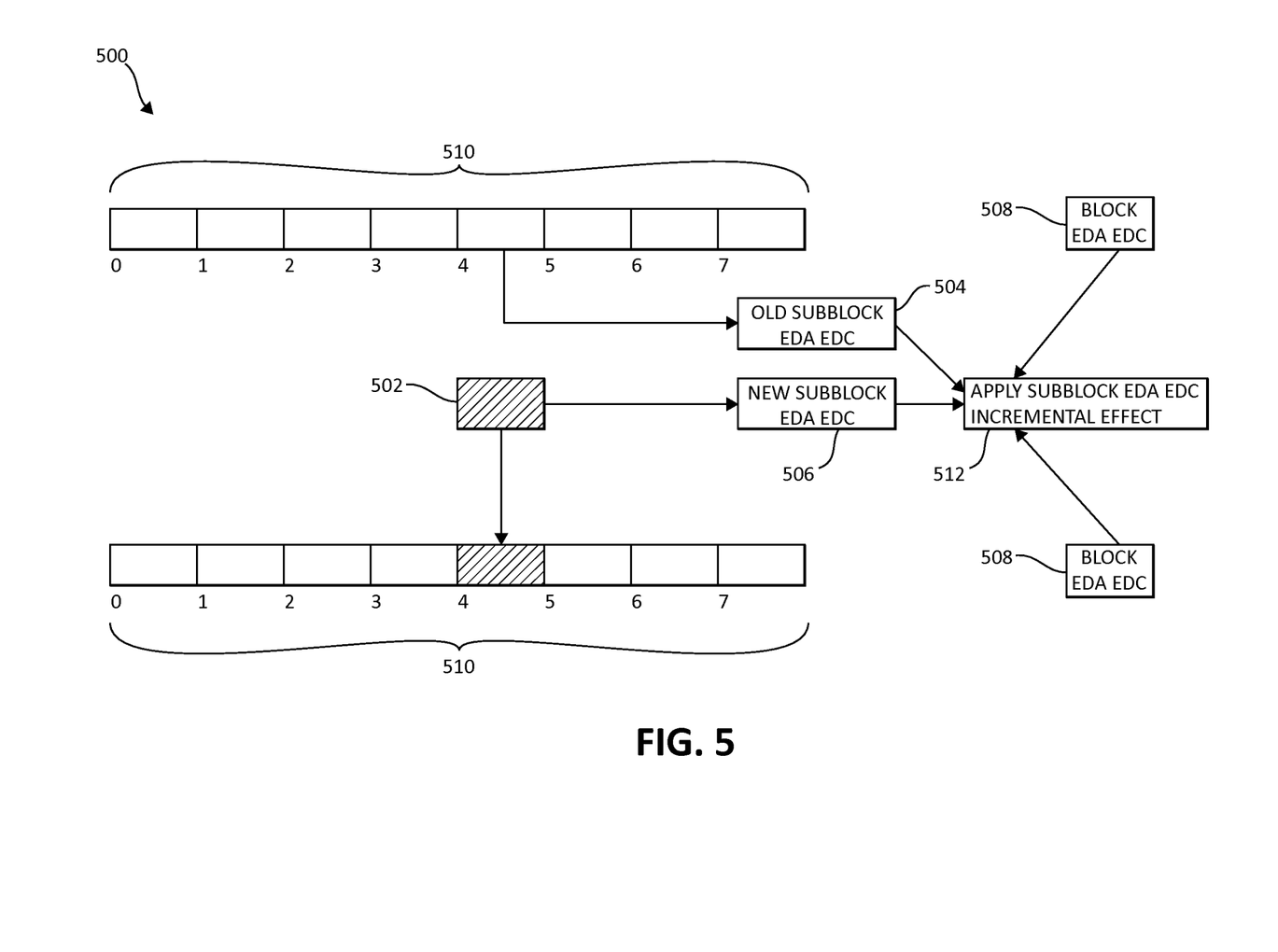
FIG. 5 illustrates an exemplary block diagram for updating the error detection code when an arbitrary sub-block of data is overwritten.

FIG. 5 illustrates an exemplary block diagram 500 for updating the error detection code when an arbitrary sub-block of data is overwritten. A data block 510 of data contains several randomly positioned sub-blocks 502 (labeled 0-7). The sub-block 502 #4 shows the random arrival of data. The digest 506 of the new sub-block 502 #4 is calculated as sub-block 502 #4 arrives. The digest of the old sub-block 504 is calculated before the new sub-block 502 is copied into the data block 508. The incremental effect of the old digest 504 is replaced with the incremental effect of the new digest 506 after the new sub-block is copied. The resource consumption (e.g., overhead) is proportional to the size of modified data (sub-block) and not proportional to the block size.

Figure 6:
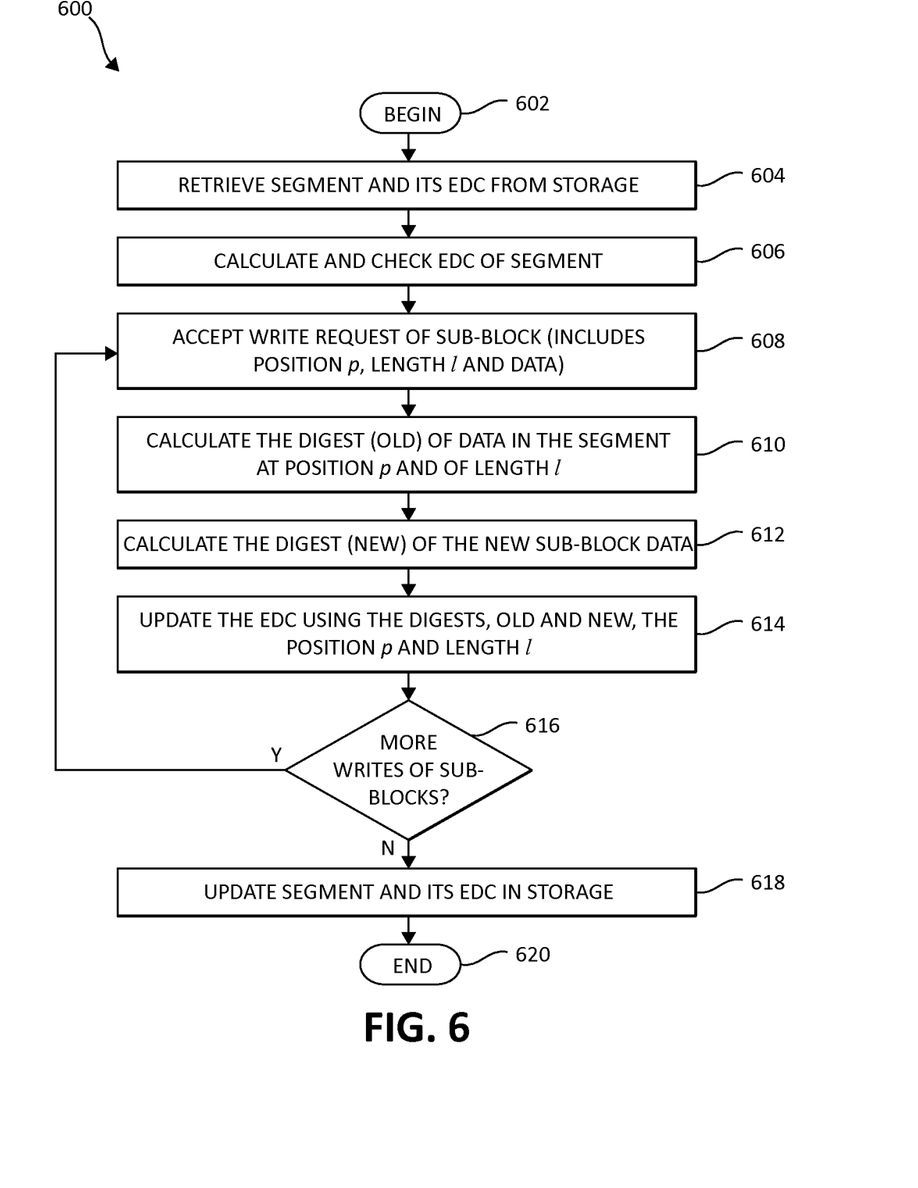
FIG. 6 is a flowchart illustrating an exemplary method for updating the error detection code when an arbitrary sub-block of data is overwritten.

As illustrated in FIGS. 3 and 6, the mechanisms of the present invention perform cheaper operations on a larger CRC using CRC of smaller sub blocks. FIGS. 3 and 6 illustrate two use cases showing the benefit. In use case number 1 (e.g., see FIG. 3), the data arrives in sub-blocks randomly, accumulated into blocks, and CRC is stored for each block. Since there is a time difference between the arrival of various sub-blocks there is also a need for sub-block CRC. Since there is no connection between the two types of CRCs (block and sub-block CRC's) both should be computed. In the second use case (e.g., see FIG. 6), a read and modify write operations are performed for a sub-block within a block. The block CRC may be computed after a read operation and before write. The sub-block CRC may be computed after sub-block arrival and after computing the updated block CRC.

FIG. 6 is a flowchart illustrating an exemplary method 600 for updating the error detection code when an arbitrary sub-block of data is overwritten. The method 600 begins (step 602). The method 600 retrieves a segment and the segment's error detection code (e.g., EDC) from storage (step 604). The EDC of the segment is calculated and checked (step 606). The method 600 accepts a write request for sub-block(s), which may include position (p), length (l), and data (step 608). The method 600 calculates the digest (e.g. old digest) of data in the segment at position (p) and length (l) (step 610). The digest (e.g., new digest) is calculated for the new sub-block data (step 612). The EDC is updated using the old digest, new digest, the position (p), and length (l) (step 614). The method 600 determines and checks if there are more writes of sub-blocks (step 616). If yes, the method 600 returns and accepts a write request for sub-block(s), which may include position (p), length (l), and data (step 608). If not, the method 600 updates the segment and the segment's EDC in storage (step 618). The method 600 ends (step 620).

In one embodiment, by way of example only, for a data block requiring a first error detection code (EDC) value to be calculated and verified and is undergoing modification for at least one randomly positioned sub-blocks that becomes available and modified in independent time intervals, a second EDC value is calculated for each of the randomly positioned sub-blocks. An incremental effect of the second EDC value is applied for calculating the first EDC value and for recalculating the first EDC value upon replacing at least one of the randomly positioned sub-blocks. The resource consumption is proportional to the size of at least one of the randomly positioned sub-blocks that are added and modified As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A method for an incremental modification of an error detection code (EDC) by a processor device in a computing storage environment, the method comprising:

for a data block requiring a first error detection code (EDC) value to be calculated and verified and is undergoing modification for at least one of a plurality of randomly positioned sub-blocks of the data block that becomes available and modified in independent time intervals:

calculating and verifying the first error detection code (EDC) value following a read operation and prior to a write operation for the data block containing the plurality of randomly positioned sub-blocks;

calculating and associating one of a plurality of second EDC values for each one of the plurality of randomly positioned sub-blocks as the data block receives each one of the plurality of randomly positioned sub-blocks;

recalculating the one of the plurality of second EDC values following modifications to the at least one of the plurality of randomly positioned sub-blocks associated with the one of the plurality of second EDC values by applying an incremental effect to the one of the plurality of second EDC values that is recalculated, wherein the incremental effect is a change to the one of the plurality of second EDC values each time the at least one of the plurality of randomly positioned sub-blocks is modified; and applying the incremental effect of the one of the plurality of second of EDC values to the first EDC value upon modifying or replacing at least one of the plurality of randomly positioned sub-blocks, wherein resource consumption overhead of calculating the one of the plurality of second EDC values is proportional to the size of the at least one of the plurality of randomly positioned sub-blocks that are added and modified rather than the size of the data block.

2. The method of claim 1, further including using a Karp-Rabin hash function for implementing the first EDC value and the plurality of second EDC values.

3. The method of claim 1, further including calculating the incremental effect of the one of the plurality of second EDC values using a Karp-Rabin hash value of the at least one of the plurality of randomly positioned sub-blocks on the Karp-Rabin hash value of the data block.

4. The method of claim 1, further including, applying at least one of a plurality of EDC functions for calculating the plurality of second EDC values.

5. The method of claim 1, wherein the incremental effect of the at least one of the plurality of randomly positioned sub-blocks is calculated according to:

$$\text{effect}_d = (d * (2^{8m} \bmod P)) \bmod P,$$

where $\text{effect}_d$ is the incremental effect, d is the one of the plurality of second EDC values of the at least one of the plurality of randomly positioned sub-blocks, m is the at least one of the plurality of randomly positioned sub-blocks, and 8 represents 8 bits in a byte, and P is a prime number.

6. The method of claim 1, wherein each of the plurality of second EDC values that are recalculated for each one of the plurality of randomly positioned sub-blocks of the data block are calculated according to at least one of the following:

$$edc_{new} = (edc_{old} + \text{effect}_{dnew} - \text{effect}_{dold}) \bmod P,$$

$$edc_{new} = (edc_{old} + ((d_{new} - d_{old}) * (2^{8m} \bmod P))) \bmod P,$$
and where $edc_{new}$ and edccrc is a newest calculated one of the plurality of second EDC values, and $edc_{old}$ is a last calculated one of the second EDC values, $\text{effect}_{dnew}$ is a newest calculated incremental effect of a newest calculated one of the second EDC values, the $\text{effect}_{dold}$ is a last calculated incremental of a last calculated one of the second EDC values, the $d_{new}$ is the newest calculated one of the second EDC values, and k is a number of fixed lengths of the at least one of the plurality of randomly positioned sub-blocks.

7. The method of claim 1, further including, calculating the first EDC value of the data block by long division with borrowing.

8. The method of claim 1, wherein the first EDC value of the data blocks is recalculated according to at least one of the following:

$$edccrc = (\text{sum}(i=0 \text{ to } i=k-1)(crc_i * (2^{8(len-(i+1)*len')} \bmod P)) \bmod P,$$

where edccrc is a newest calculated first EDC value, k is a number of fixed lengths of the at least one of the plurality of randomly positioned sub-blocks, i is an arbitrary value representing the number of the first EDC value, $crc_i$ is the ith number of the first EDC value, 8 is 8 bits in a byte, len is a fixed length of the at least one of the plurality of randomly positioned sub-blocks, i is an arbitrary value, and P is a 32-bit prime number.

9. A system for an incremental modification of an error detection code by a processor device in a computing storage environment, the method comprising:

a processor device operable in the computing environment, wherein processor device is adapted for:

for a data block requiring a first error detection code (EDC) value to be calculated and verified and is undergoing modification for at least one of a plurality of randomly positioned sub-blocks of the data block that becomes available and modified in independent time intervals:

calculating and verifying the first error detection code (EDC) value following a read operation and prior to a write operation for the data block containing the plurality of randomly positioned sub-blocks;

calculating and associating one of a plurality of second EDC values for each one of the plurality of randomly positioned sub-blocks as the data block receives each one of the plurality of randomly positioned sub-blocks;

recalculating the one of the plurality of second EDC values following modifications to the at least one of the plurality of randomly positioned sub-blocks associated with the one of the plurality of second EDC values by applying an incremental effect to the one of the plurality of second EDC values that is recalculated, wherein the incremental effect is a change to the one of the plurality of second EDC values each time the at least one of the plurality of randomly positioned sub-blocks is modified; and applying the incremental effect of the one of the plurality of second of EDC values to the first EDC value upon modifying or replacing at least one of the plurality of randomly positioned sub-blocks, wherein resource consumption overhead of calculating the one of the plurality of second EDC values is proportional to the size of the at least one of the plurality of randomly positioned sub-blocks that are added and modified rather than the size of the data block.

10. The system of claim 9, wherein the processor device is further adapted for using a Karp-Rabin hash function for implementing the first EDC value and the plurality of second EDC values.

11. The system of claim 9, wherein the processor device is further adapted for calculating the incremental effect of the one of the plurality of second EDC values using a Karp-Rabin hash value of the at least one of the plurality of randomly positioned sub-blocks on the first EDC value using the Karp-Rabin hash value of the data block.

12. The system of claim 9, wherein the processor device is further adapted for, applying at least one of a plurality of EDC functions for calculating the plurality of second EDC values.

13. The system of claim 9, wherein the incremental effect of the at least one of the plurality of randomly positioned sub-blocks is calculated according to:

$$\text{effect}_d = (d * (2^{8m} \bmod P)) \bmod P,$$

where $\text{effect}_d$ is the incremental effect, d is the one of the plurality of second EDC values of the at least one of the plurality of randomly positioned sub-blocks, m is the at least one of the plurality of randomly positioned sub-blocks, and 8 represents 8 bits in a byte, and P is a prime number.

14. The system of claim 9, wherein each of the plurality of second EDC values that are recalculated for each one of the plurality of randomly positioned sub-blocks of the data block are calculated according to at least one of the following:

$$edc_{new} = (edc_{old} + \text{effect}_{dnew} - \text{effect}_{dold}) \bmod P,$$

$$edc_{new} = (edc_{old} + ((d_{new} - d_{old}) * (2^{8m} \bmod P))) \bmod P,$$
and where $edc_{new}$ and edccrc is a newest calculated one of the plurality of second EDC values, and $edc_{old}$ is a last calculated one of the second EDC values, $\text{effect}_{dnew}$ is a newest calculated incremental effect of a newest calculated one of the second EDC values, the $\text{effect}_{dold}$ is a last calculated incremental of a last calculated one of the second EDC values, the $d_{new}$ is the newest calculated one of the second EDC values, and k is a number of fixed lengths of the at least one of the plurality of randomly positioned sub-blocks.

15. The system of claim 9, wherein the processor device is further adapted for, calculating the first EDC value of the data block by long division with borrowing.

16. The system of claim 9, wherein the first EDC value of the data blocks is recalculated according to at least one of the following:

$$edccrc = (\text{sum}(i=0 \text{ to } i=k-1)(crc_i * (2^{8(len-(i+1)*len')} \bmod P)) \bmod P,$$

where edccrc is a newest calculated first EDC value, k is a number of fixed lengths of the at least one of the plurality of randomly positioned sub-blocks, i is an arbitrary value representing the number of the first EDC value, $crc_i$ is the ith number of the first EDC value, 8 is 8 bits in a byte, len is a fixed length of the at least one of the plurality of randomly positioned sub-blocks, i is an arbitrary value, and P is a 32-bit prime number.

17. A computer program product for an incremental modification of an error detection code in a computing environment by a processor device, the computer program product comprising a non-transitory computer-readable storage medium having computer-readable program code portions stored therein, the computer-readable program code portions comprising:

a first executable portion for a data block requiring a first error detection code (EDC) value to be calculated and verified and is undergoing modification for at least one of a plurality of randomly positioned sub-blocks of the data block that becomes available and modified in independent time intervals:

a second executable portion for calculating and verifying the first error detection code (EDC) value following a read operation and prior to a write operation for the data block containing the plurality of randomly positioned sub-blocks;

a third executable portion for calculating and associating one of a plurality of second EDC values for each one of the plurality of randomly positioned sub-blocks as the data block receives each one of the plurality of randomly positioned sub-blocks;

a third executable portion for recalculating the one of the plurality of second EDC values following modifications to the at least one of the plurality of randomly positioned sub-blocks associated with the one of the plurality of second EDC values by applying an incremental effect to the one of the plurality of second EDC values that is recalculated, wherein the incremental effect is a change to the one of the plurality of second EDC values each time the at least one of the plurality of randomly positioned sub-blocks is modified; and a fourth executable portion for applying the incremental effect of the one of the plurality of second of EDC values to the first EDC value upon modifying or replacing at least one of the plurality of randomly positioned sub-blocks, wherein resource consumption overhead of calculating the one of the plurality of second EDC values is proportional to the size of the at least one of the plurality of randomly positioned sub-blocks that are added and modified rather than the size of the data block.

18. The computer program product of claim 17, further including a fifth executable portion for using a Karp-Rabin hash function for implementing the first EDC value and the plurality of second EDC values.

19. The computer program product of claim 17, further including a fifth executable portion for calculating the incremental effect of the one of the plurality of second EDC values using a Karp-Rabin hash value of the at least one of the plurality of randomly positioned sub-blocks on the first EDC value using the Karp-Rabin hash value of the data block.

20. The computer program product of claim 17, further including a fifth executable portion for applying at least one of a plurality of EDC functions for calculating the plurality of second EDC values.

21. The computer program product of claim 17, wherein the incremental effect of the at least one of the plurality of randomly positioned sub-blocks is calculated according to:

$$\text{effect}_d = (d * (2^{8m} \bmod P)) \bmod P,$$

where $\text{effect}_d$ is the incremental effect, d is the one of the plurality of second EDC values of the at least one of the plurality of randomly positioned sub-blocks, m is the at least one of the plurality of randomly positioned sub-blocks, and 8 represents 8 bits in a byte, and P is a prime number.

22. The computer program product of claim 17, wherein each of the plurality of second EDC values that are recalculated for each one of the plurality of randomly positioned sub-blocks of the data block are calculated according to at least one of the following:

$$edc_{new} = (edc_{old} + \text{effect}_{dnew} - \text{effect}_{dold}) \bmod P,$$

$$edc_{new} = (edc_{old} + ((d_{new} - d_{old}) * (2^{8m} \bmod P))) \bmod P,$$
and where $edc_{new}$ and edccrc is a newest calculated one of the plurality of second EDC values, and $edc_{old}$ is a last calculated one of the second EDC values, $\text{effect}_{dnew}$ is a newest calculated incremental effect of a newest calculated one of the second EDC values, the $\text{effect}_{dold}$ is a last calculated incremental of a last calculated one of the second EDC values, the $d_{new}$ is the newest calculated one of the second EDC values, and k is a number of fixed lengths of the at least one of the plurality of randomly positioned sub-blocks.

23. The computer program product of claim 17, further including a fifth executable portion for, calculating the first EDC value of the data block by long division with borrowing.

24. The computer program product of claim 17, wherein the first EDC value of the data blocks is recalculated according to at least one of the following:

$$edccrc = (\text{sum}(i=0 \text{ to } i=k-1)(crc_i * (2^{8(len-(i+1)*len')} \bmod P)) \bmod P,$$

where edccrc is a newest calculated first EDC value, k is a number of fixed lengths of the at least one of the plurality of randomly positioned sub-blocks, i is an arbitrary value representing the number of the first EDC value, $crc_i$ is the ith number of the first EDC value, 8 is 8 bits in a byte, len is a fixed length of the at least one of the plurality of randomly positioned sub-blocks, i is an arbitrary value, and P is a 32-bit prime number.

* * * * *